United States Patent
Hsieh et al.

(10) Patent No.: US 10,262,868 B1
(45) Date of Patent: Apr. 16, 2019

(54) SELF-ALIGNED PLANARIZATION OF LOW-K DIELECTRICS AND METHOD FOR PRODUCING THE SAME

(71) Applicant: GLOBALFOUNDRIES Singapore Pte. Ltd., Singapore (SG)

(72) Inventors: Curtis Chun-I Hsieh, Singapore (SG); Wanbing Yi, Singapore (SG); Yi Jiang, Singapore (SG); Juan Boon Tan, Singapore (SG); Zhehui Wang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/786,132

(22) Filed: Oct. 17, 2017

(51) Int. Cl.
| | |
|---|---|
| *H01L 21/3065* | (2006.01) |
| *H01L 21/311* | (2006.01) |
| *G11C 11/16* | (2006.01) |
| *H01L 21/3105* | (2006.01) |
| *H01L 27/22* | (2006.01) |
| *H01L 43/12* | (2006.01) |
| *H01L 43/08* | (2006.01) |

(52) U.S. Cl.
CPC ...... *H01L 21/31055* (2013.01); *G11C 11/161* (2013.01); *H01L 21/31116* (2013.01); *H01L 27/222* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | |
|---|---|---|
| 5,461,010 A | 10/1995 | Chen et al. |
| 5,814,564 A | 9/1998 | Yao et al. |
| 6,784,091 B1 * | 8/2004 | Nuetzel ............... B82Y 10/00 257/E21.577 |
| 9,349,772 B2 | 5/2016 | Yi et al. |
| 2016/0268336 A1 | 9/2016 | Shum et al. |
| 2016/0322090 A1 * | 11/2016 | Chan ................ G11C 11/161 |
| 2017/0092693 A1 | 3/2017 | Tan et al. |
| 2017/0110649 A1 * | 4/2017 | Diaz ................. H01L 27/222 |

* cited by examiner

*Primary Examiner* — Shamim Ahmed
(74) *Attorney, Agent, or Firm* — Ditthavong & Steiner, P. C.

(57) ABSTRACT

A method of forming a uniform self-aligned low-k layer with a large process window for inserting a memory array with pillar/convex topography and the resulting device are provided. Embodiments include forming a substrate with a first region and a second region; forming a first low-K layer over the substrate; forming an oxide layer over the first low-K layer; forming a spacer over the oxide layer; etching the spacer to expose the oxide layer in the first region; removing the oxide layer and a portion of the first low-K layer in the first region and a portion of the oxide layer and a portion of the spacer in the second region; removing the spacer in the second region; cleaning the first low-K layer and the oxide layer, a triangular-like shaped portion of the oxide layer remaining; and forming a second low-K layer over the substrate.

14 Claims, 7 Drawing Sheets

SELF-ALIGNED PLANARIZATION OF LOW-K DIELECTRICS AND METHOD FOR PRODUCING THE SAME

TECHNICAL FIELD

The present disclosure relates to memory design for semiconductor devices. The present disclosure is particularly applicable to processes for forming self-aligned low-k dielectrics in magnetic random-access memory (MRAM) devices.

BACKGROUND

Presently, the top contact process window is small and normally insufficient for inserting emerging memories, e.g., MRAM, resistive random-access memory (ReRAM) and ferroelectric random-access memory (FeRAM), into back-end-of-line (BEOL) low-K process steps because the critical dimension (CD) of these memory cells are smaller compared to normal BEOL process variations from planarization, e.g., the top connection of an MRAM has no margin because the CD of a magnetic tunnel junction (MTJ) is small and variations from planarization are much larger. In addition, the conventional spin-on-glass (SOG) and etch back processes result in higher SOG dielectric constant than the BEOL low-k that defeats the resistance capacitance (RC) benefit of BEOL low-k. Further, these processes neither cater to localized array topography nor to process variations.

Figure 1:
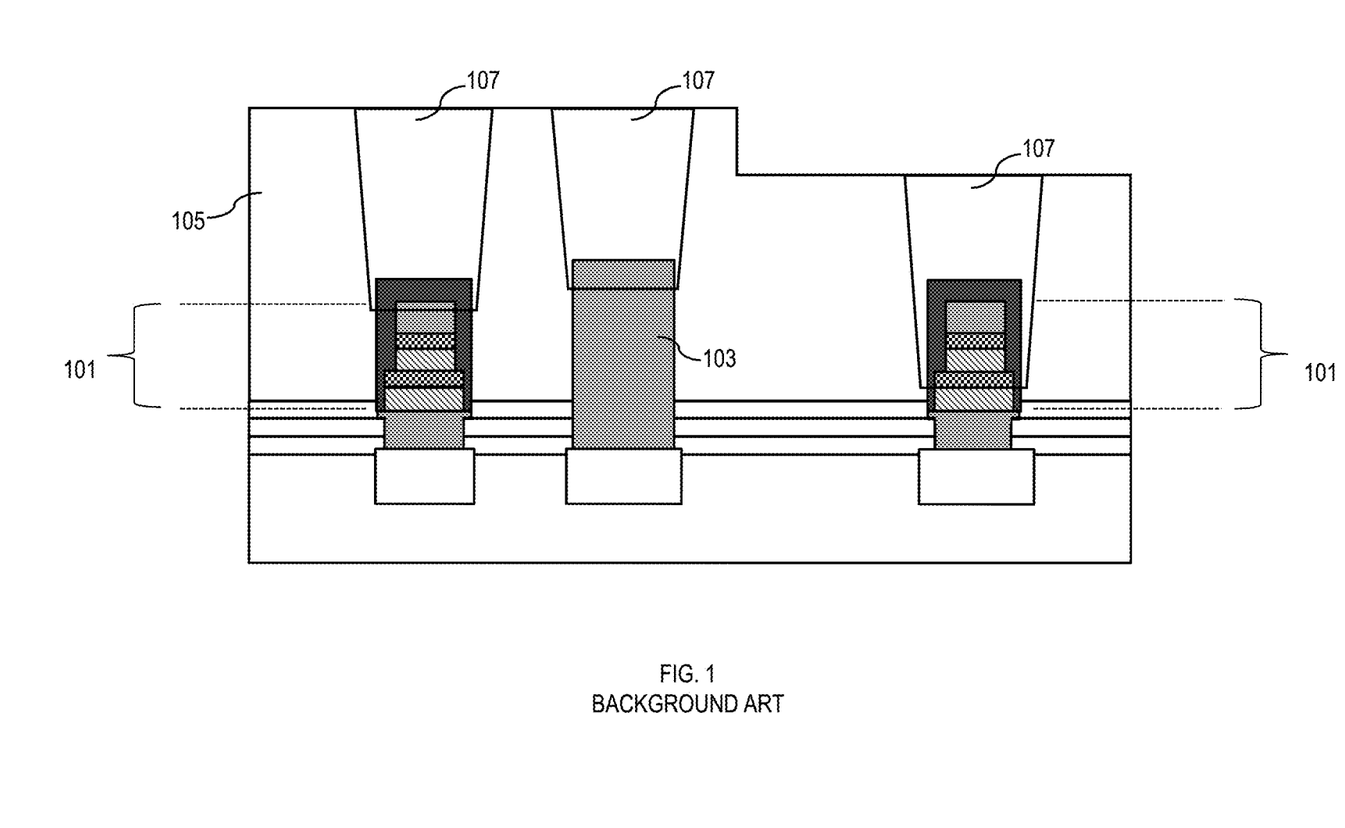
FIG. 1 schematically illustrates a cross-sectional view of a background MRAM device.

Referring to FIG. 1 (cross-sectional view), the top connection for a known MRAM 101 and pillar contact 103 has no margin because of smaller CD and larger variations from planarization. The deposition of low-K layer 105, e.g., formed of hydrogenated oxidized silicon carbon (SiCOH), over the MRAM 101 and pillar contact 103 results in varying heights and the chemical mechanical planarization (CMP) time to planarize the topography results in bad uniformity. In addition, the taller pillar contact 103 may cause an uneven height that a CMP may not uniformly planarize, adding to the cost and complexity of the process. Further, if there is a contact etch process, the trapezoids 107 illustrate how the contact bottom varies due to the SiCOH 105 typography.

A need therefore exists for a methodology for forming a uniform low-k topography over a memory array with a large process window at a low cost.

SUMMARY

An aspect of the present disclosure is a method of forming a uniform self-aligned low-k layer with a large process window for inserting a memory array with pillar/convex topography into BEOL low-k process steps.

Another aspect of the present disclosure is a device including a uniform self-aligned low-k layer over a memory array with pillar/convex topography.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a substrate with a first region and a second region; forming a first low-K layer over the substrate; forming an oxide layer over the first low-K layer; forming a spacer over the oxide layer; etching the spacer to expose the oxide layer in the first region; removing the oxide layer and a portion of the first low-K layer in the first region and a portion of the oxide layer and a portion of the spacer in the second region; removing the spacer in the second region; cleaning the first low-K layer and the oxide layer, a triangular-like shaped portion of the oxide layer remaining; and forming a second low-K layer over the substrate.

Aspects of the present disclosure include the first region including a memory region and the second region including a logic region. Further aspects include forming the first low-K layer and the second low-K layer of a SiCOH dielectric film or a similar interlayer dielectric (ILD) material. Another aspect includes forming the substrate by: forming an ILD; forming a pair of copper (Cu) BEOL structures laterally separated in the ILD in the first region; forming a capping layer over the ILD and portions of the pair of CU BEOL structures; forming an oxide layer over the capping layer; forming a first and a second via through the oxide layer and the capping layer down to each of the Cu BEOL structures, respectively; filling the first via with a metal layer; forming a MTJ structure over the metal layer; and forming a nitride layer over and along sidewalls of the MTJ structure and the oxide layer prior to forming the first low-K layer. Further aspects include forming a pillar contact through the second via over the Cu BEOL structure; and forming a first low-K layer over the pillar contact. Additional aspects include forming the first low-K layer in the first region to a thickness that is proportional to a height of the MTJ structure and the pillar contact. Further aspects include etching the spacer by a dry etch or a reactive ion etching (RIE). Additional aspects include removing the oxide layer and a portion of the first low-K layer in the first region and the portion of oxide layer and the portion of the spacer in the second region by: a dry etch, RIE or a timed etch. Further aspects include removing the spacer by: stripping, wherein the stripping damages an upper surface of the first low-K layer in the first region. Another aspect includes cleaning the first low-K layer in the first region and the oxide layer in the second region until the damaged upper surface is removed, the remaining triangular-like shaped portion formed.

Another aspect of the present disclosure is a device including: an ILD with a first region and a second region; a pair of Cu BEOL structures laterally separated in the ILD in the first region; a capping layer over the ILD and a portion of the Cu BEOL structures; an oxide layer over the capping layer; a metal filled via through the oxide layer and the capping layer down to a Cu BEOL structure; a MTJ structure over the metal filled via; a top electrode (TE) over the MTJ structure; a nitride layer over and along sidewalls of the MTJ structure, the TE and the oxide layer; a first low-K layer over the ILD; a triangular-like shaped second oxide layer over the first low-K layer in the second region of the ILD; and a second low-K layer over the ILD.

Aspects of the device include a pillar contact through the second oxide layer and the capping layer down to a Cu BEOL structure. Another aspect includes the first region including a memory region and the second region including a logic region. A further aspect includes the TE including tantalum nitride (TaN). Other aspects include the metal filled via including TaN. Another aspect includes the first low-K layer and the second low-K layer including a SiCOH dielectric film or a similar ILD material.

A further aspect of the present disclosure is a method including: forming a substrate with a first region and a second region; forming a first low-K layer of a SiCOH dielectric film or a similar ILD material over the substrate; forming an oxide layer over the first low-K layer; forming a spacer of spin-on-hardmask (SOH), a nitride floating cap (NFC), a silicon dioxide ($SiO_2$) based material, a spin-on-coating based material or an inorganic spin-on-coating based material over the oxide layer; etching the spacer by a dry etch or a RIE to expose the oxide layer in the first region; removing the oxide layer and a portion of the first low-K layer in the first region and a portion of the oxide layer and a portion of the spacer in the second region by a dry etch, RIE or a timed etch; removing the spacer in the second region by stripping; cleaning the first low-K layer and the oxide layer with hydrofluoric acid (HF), a triangular-like shaped portion of the oxide layer remaining; and forming a second low-K layer of a SiCOH dielectric film or a similar ILD material over the substrate.

Aspects of the present disclosure include the first region including a memory region and the second region including a logic region. Another aspect includes forming the substrate by: forming an ILD; forming a pair of Cu BEOL structures laterally separated in the ILD in the first region; forming a capping layer over the ILD and portions of the pair of CU BEOL structures; forming an oxide layer over the capping layer; forming a first and a second via through the oxide layer and the capping layer down to each of the Cu BEOL structures, respectively; filling the first via with a metal layer; forming a MTJ structure over the metal layer; and forming a nitride layer over and along sidewalls of the MTJ structure and the oxide layer prior to forming the first low-K layer. A further aspect includes forming a pillar contact including of memory device or electrodes through the second via over the Cu BEOL structure; and forming a first low-K layer over the pillar contact.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of a small and normally insufficient top contact process window and uneven resulting low-K topography attendant upon inserting emerging memories with pillar/convex topography into BEOL low-K process steps. The problems are solved, inter alia, by forming a self-aligned low-K layer with a large process window and resultant uniform topography.

Methodology in accordance with embodiments of the present disclosure includes forming a substrate with a first region and a second region. A first low-K layer is formed over the substrate. An oxide layer is formed over the first low-K layer. A spacer is formed over the oxide layer, and is etched to expose the oxide layer in the first region. The oxide layer and a portion of the first low-K layer in the first region and a portion of the oxide layer and a portion of the spacer in the second region are removed. The spacer in the second region is removed. The first low-K layer and the oxide layer are cleaned, a triangular-like shaped portion of the oxide layer remaining, and a second low-K layer is formed over the substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
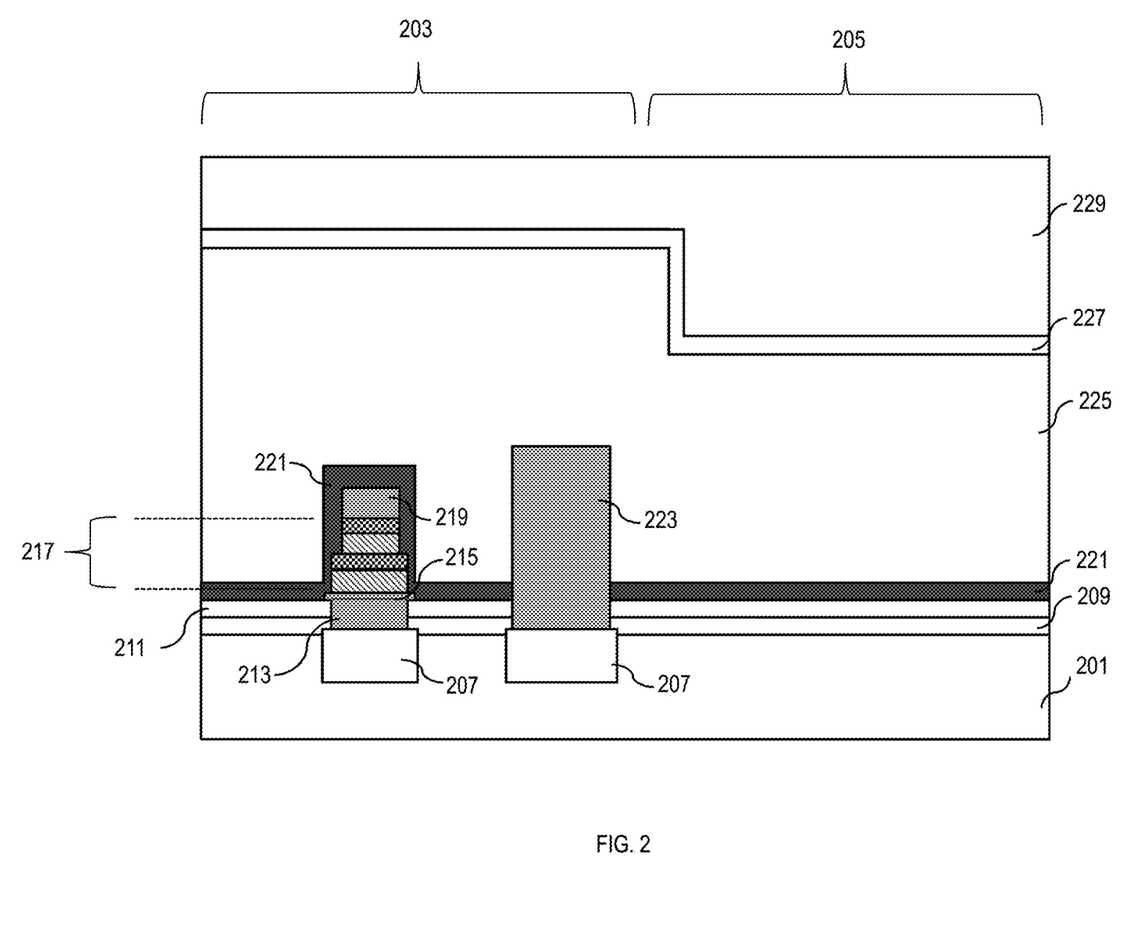
FIGS. 2 through 7 schematically illustrates cross-sectional views of a process flow for forming a uniform self-aligned low-k layer with a large process window for inserting a memory array with pillar/convex topography into BEOL low-K process steps, in accordance with an exemplary embodiment.

FIGS. 2 through 7 schematically illustrate cross-sectional views of a process flow for forming a uniform self-aligned low-k layer with a large process window for inserting a memory array with pillar/convex topography into BEOL low-K process steps, in accordance with an exemplary embodiment. Referring to FIG. 2, an ILD 201 is formed with region 203 and region 205, wherein region 203 includes a memory region and region 205 includes a logic region. The Cu BEOL structures 207 are formed laterally separated in the ILD 201 in region 203. Then, a capping layer 209 is formed, e.g., of silicon nitride (SiN) or Nblok, over the ILD 201 and portions of the CU BEOL structures 207. Next, an oxide layer 211 is formed, e.g., of silicon oxide, over the capping layer 209. Then, via 213 and a second via (not shown for illustrative convenience) are formed through the oxide layer 211 and the capping layer 209 down to each of the Cu BEOL structures 207. Next, the via 213 is filled with a metal layer, e.g., TaN, and a bottom electrode (BE) 215 is formed over the metal layer 213. In this instance the BE 215 is depicted as extending past the metal layer 213, however, it is contemplated that the sides of the BE 215 may also be flush with the metal layer. An MTJ structure 217 is formed over the BE 215 and metal layer 213. Then, a TE 219 is formed, e.g., of TaN, over the MTJ structure 217. The MTJ structure 217 and the TE 219 are etched simultaneously during a patterning process. Next, a nitride layer 221 is formed, e.g., of SiN or any encapsulation materials, over and along sidewalls of the MTJ structure 217, TE 219 and over the oxide layer 211. In another instance, a pillar contact 223 is formed, e.g., of a memory device or an electrode, through the second via over the second Cu BEOL structure 207. Then, a low-K layer 225 is formed, e.g., of SiCOH dielectric film or a similar ILD material, over the ILD 201. The thickness of the low-K layer 225 in region 203 is proportional to the height of the MTJ structure 217 and the pillar contact 223. The low-K layer 225 may have a convex profile based on the etch rate at a center portion of the ILD 201. Next, an oxide layer 227 is formed over the low-K layer 225. Subsequently, a spacer 229 is formed, e.g., of SOH, NFC, SiO$_2$ based material, a spin-on-coating based material, an inorganic spin-on-coating based material, and the like, over the oxide layer 227.

Figure 3:
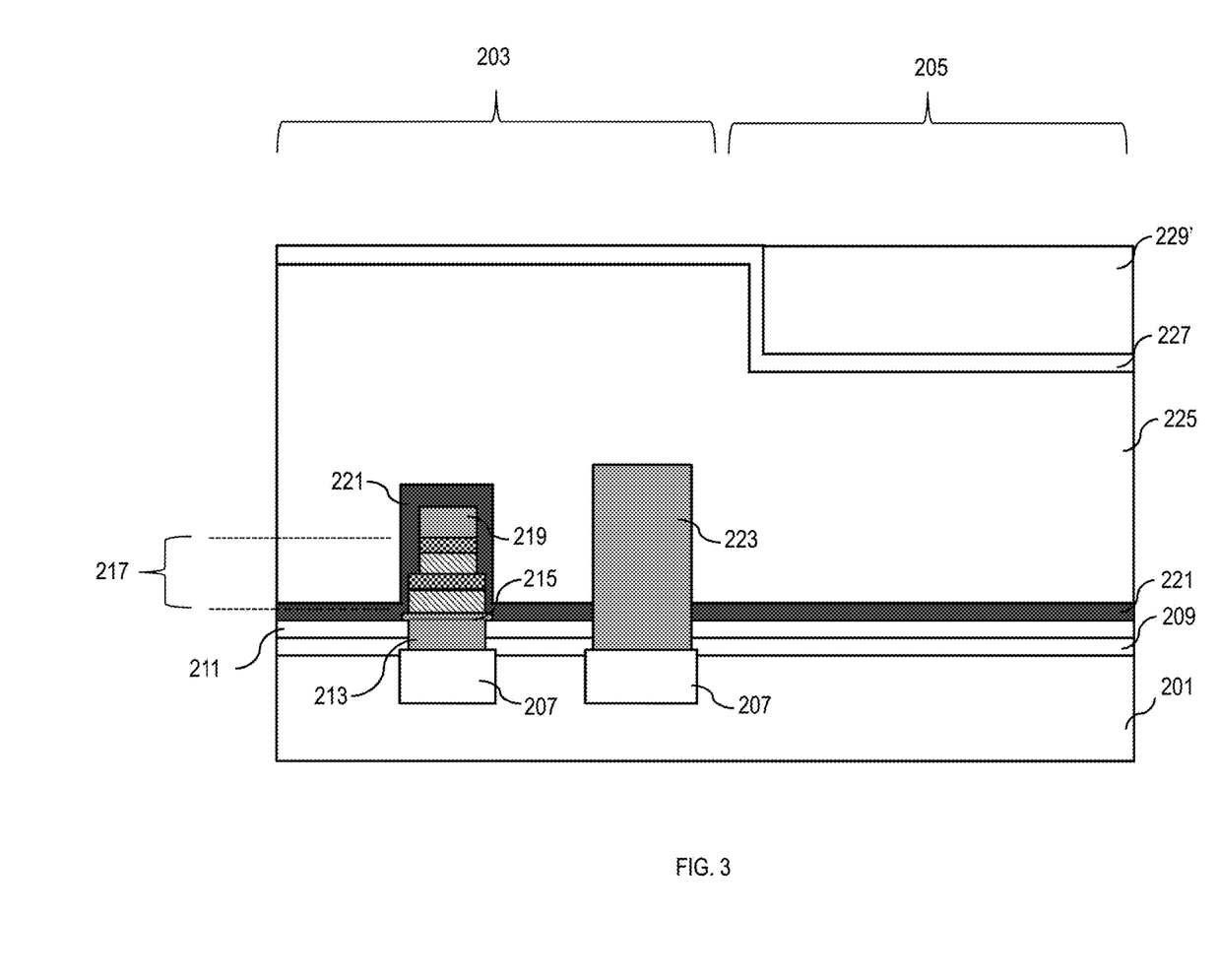
Figure 4:
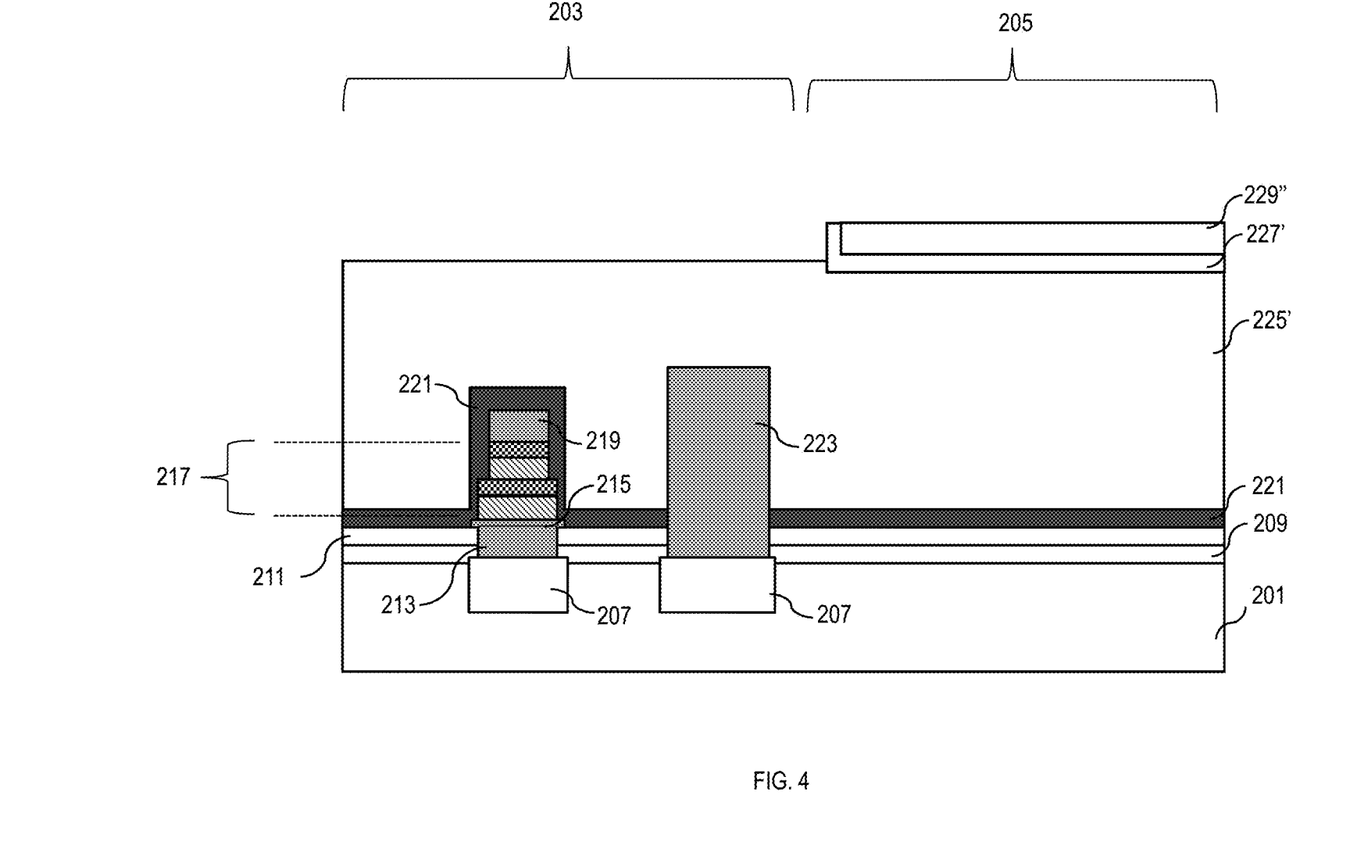

As illustrated in FIG. 3, the spacer 229 is etched, e.g., by a dry etch or a RIE, down to the oxide layer 227 in region 203, forming spacer 229' in region 205. As depicted in FIG. 4, the oxide layer 227 and a portion of the low-K layer 225 in region 203 are removed, e.g., a dry etch, RIE or a timed etch, along with a portion of the oxide layer 227 and a portion of the spacer 229' in region 205, forming the low-K layer 225', oxide layer 227' and spacer 229", respectively.

Figure 5:
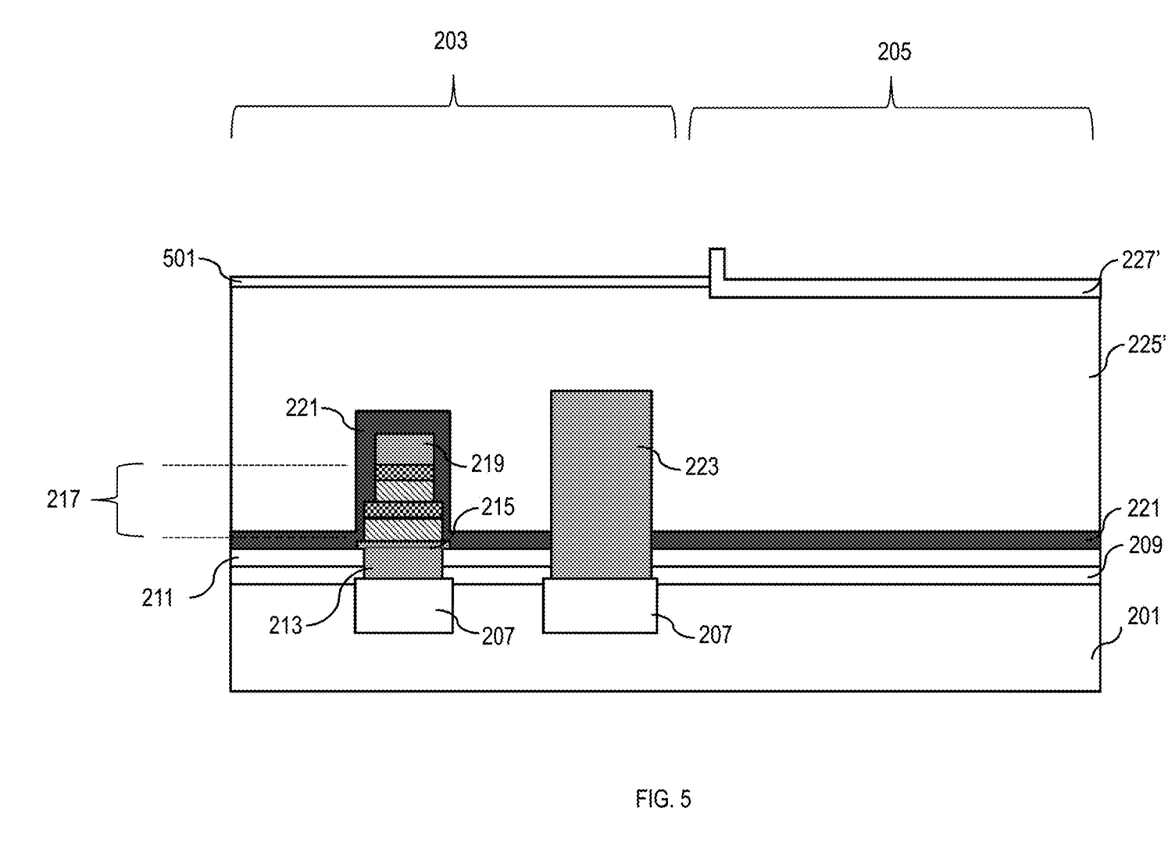
Figure 6:
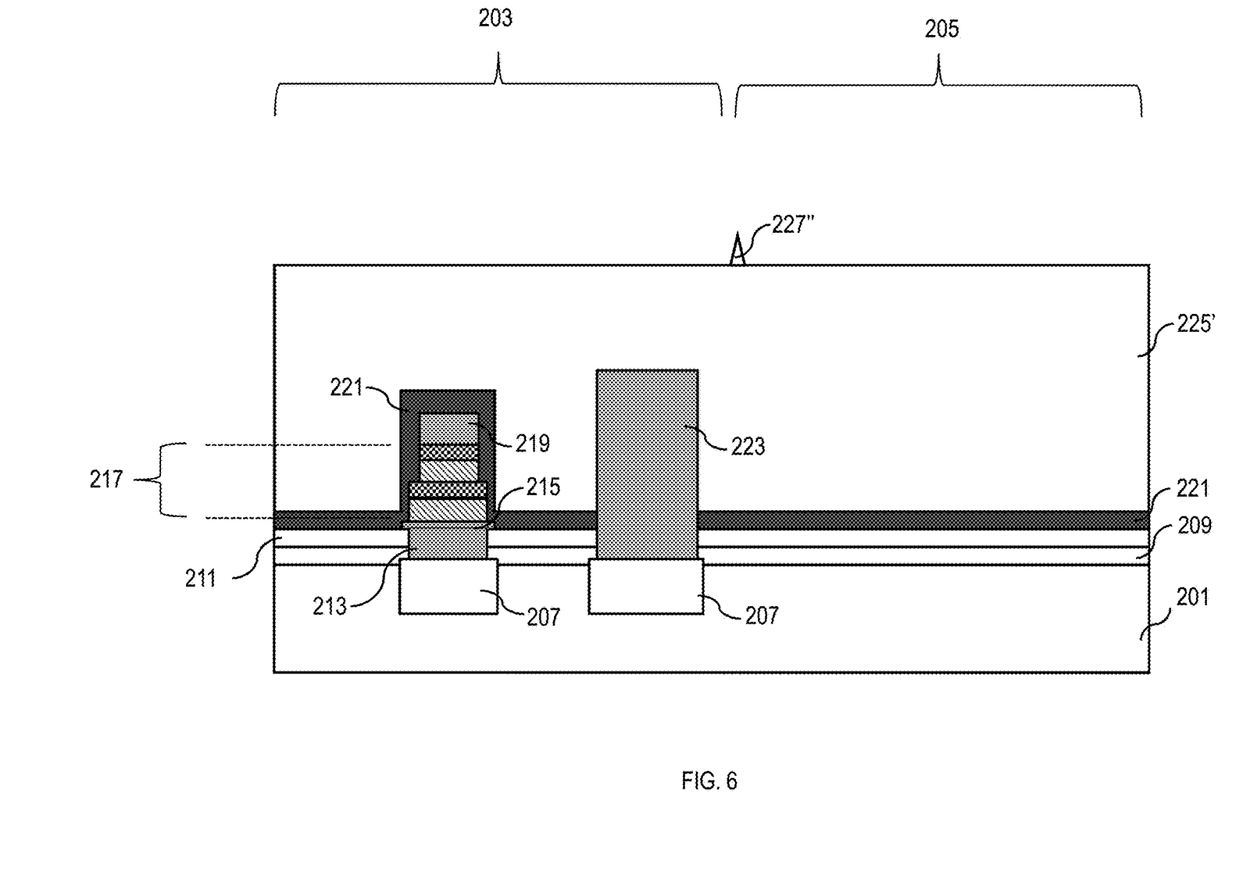
Figure 7:
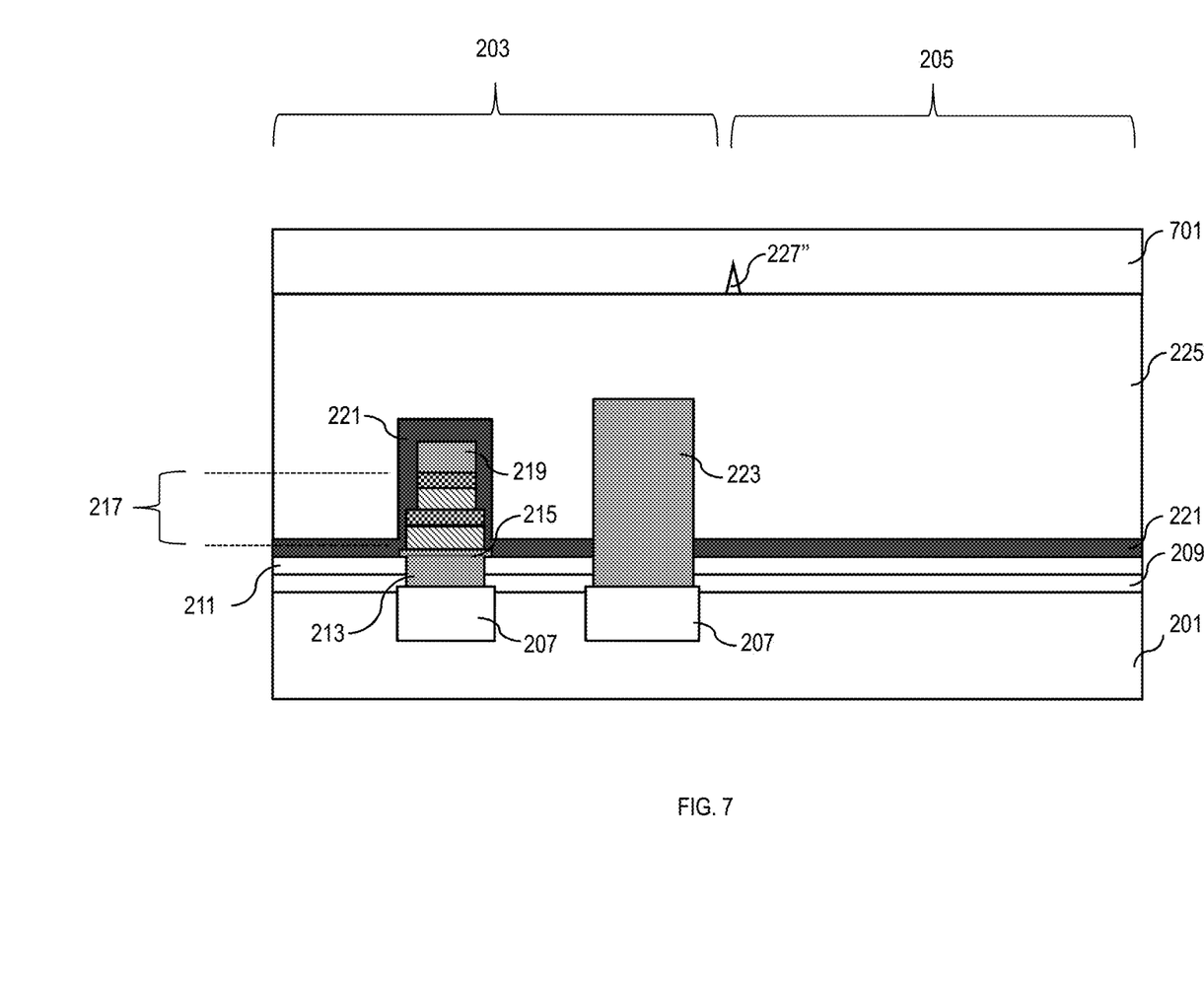

Referring to FIG. 5, the spacer 229" in region 205 is removed, e.g., by stripping; however, the removal process consequently damages the upper surface of the low-K layer 225' in region 203, represented by the area 501. Then, the low-K layer 225' and the oxide layer 227' are cleaned, e.g., with HF, until the damaged area 501 of the low-K layer 225' is removed, thereby forming a triangular-like shaped portion of the oxide layer 227" over the low-K layer 225' in region 205, as illustrated in FIG. 6. In this instance the triangular-like shaped portion of the oxide layer 227" has a rounded tip. Subsequently, a low-K layer 701 is formed, e.g., of SiCOH dielectric film or a similar ILD material, over the ILD 201, as depicted in FIG. 7.

The embodiments of the present disclosure can achieve several technical effects including forming a uniform self-aligned low-K layer with a large process window for inserting a memory array with pillar/convex topography; the achievement of lower costs due to the self-alignment; smaller within wafer (WIW) variation, e.g., WIW variations of the planarization is minimized to less than 11.3 nanometer (nm) and no within die (WID) variation compared to a CMP process. Further, since a dummy MTJ is not formed in the logic region, there is no impact on the RC of BEOL low-K. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including MRAMs, ReRAMs and FeRAMs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a substrate with a first region and a second region;
   forming a first low-K layer over the substrate;
   forming an oxide layer over the first low-K layer;
   forming a spacer over the oxide layer;
   etching the spacer to expose the oxide layer in the first region;
   removing the oxide layer and a portion of the first low-K layer in the first region and a portion of the oxide layer and a portion of the spacer in the second region;
   removing the spacer in the second region;
   cleaning the first low-K layer and the oxide layer, a triangular shaped portion of the oxide layer remaining; and
   forming a second low-K layer over the substrate.

2. The method according to claim 1, wherein the first region comprises a memory region and the second region comprises a logic region.

3. The method according to claim 1, comprising forming the first low-K layer and the second low-K layer of a hydrogenated oxidized silicon carbon (SiCOH) dielectric film or a similar interlayer dielectric (ILD) material.

4. The method according to claim 1, comprising forming the substrate by:
   forming an ILD;
   forming a pair of copper (Cu) back-end-of-line (BEOL) structures laterally separated in the ILD in the first region;
   forming a capping layer over the ILD and portions of the pair of CU BEOL structures;
   forming an oxide layer over the capping layer;
   forming a first and a second via through the oxide layer and the capping layer down to each of the Cu BEOL structures, respectively;
   filling the first via with a metal layer;
   forming a magnetic tunnel junction (MTJ) structure over the metal layer; and
   forming a nitride layer over and along sidewalls of the MTJ structure and the oxide layer prior to forming the first low-K layer.

5. The method according to claim 4, further comprising:
   forming a pillar contact through the second via over the Cu BEOL structure; and
   forming a first low-K layer over the pillar contact.

6. The method according to claim 4, comprising forming the first low-K layer in the first region to a thickness that is proportional to a height of the MTJ structure and the pillar contact.

7. The method according to claim 1, comprising etching the spacer by a dry etch or a reactive ion etching (RIE).

8. The method according to claim 1, comprising removing the oxide layer and a portion of the first low-K layer in the first region and the portion of oxide layer and the portion of the spacer in the second region by:
   a dry etch, RIE or a timed etch.

9. The method according to claim 1, comprising removing the spacer by:
   stripping,
   wherein the stripping damages an upper surface of the first low-K layer in the first region.

10. The method according to claim 9, comprising cleaning the first low-K layer in the first region and the oxide layer in the second region until the damaged upper surface is removed, the remaining triangular shaped portion formed.

11. A method comprising:
    forming a substrate with a first region and a second region;

forming a first low-K layer of a hydrogenated oxidized silicon carbon (SiCOH) dielectric film or a similar interlayer dielectric (ILD) material over the substrate;

forming an oxide layer over the first low-K layer;

forming a spacer over the oxide layer;

etching the spacer by a dry etch or a reactive ion etching (RIE) to expose the oxide layer in the first region;

removing the oxide layer and a portion of the first low-K layer in the first region and a portion of the oxide layer and a portion of the spacer in the second region by a dry etch, RIE or a timed etch;

removing the spacer in the second region by stripping;

cleaning the first low-K layer and the oxide layer with hydrofluoric acid (HF), a triangular shaped portion of the oxide layer remaining; and forming a second low-K layer of a SiCOH dielectric film or a similar ILD material over the substrate.

12. The method according to claim 11, wherein the first region comprises a memory region and the second region comprises a logic region.

13. The method according to claim 11, comprising forming the substrate by:

forming an ILD;

forming a pair of copper (Cu) back-end-of-line (BEOL) structures laterally separated in the ILD in the first region;

forming a capping layer over the ILD and portions of the pair of CU BEOL structures;

forming an oxide layer over the capping layer;

forming a first and a second via through the oxide layer and the capping layer down to each of the Cu BEOL structures, respectively;

filling the first via with a metal layer;

forming a magnetic tunnel junction (MTJ) structure over the metal layer; and forming a nitride layer over and along sidewalls of the MTJ structure and the oxide layer prior to forming the first low-K layer.

14. The method according to claim 13, further comprising:

forming a pillar contact comprising of memory device or electrodes through the second via over the Cu BEOL structure; and forming a first low-K layer over the pillar contact.

* * * * *